United States Patent

Olivei et al.

[15] 3,636,470

[45] Jan. 18, 1972

[54] VARIABLE INDUCTANCE-CONTROLLED OSCILLATOR SWITCHING CIRCUIT

[72] Inventors: Alfredo Olivei; Guido Florentino, both of Ivrea, Turin, Italy

[73] Assignee: Ing. C. Olivetti & C., S.p.A., Ivrea, Turin, Italy

[22] Filed: Oct. 27, 1970

[21] Appl. No.: 84,527

Related U.S. Application Data

[63] Continuation of Ser. No. 779,993, Nov. 29, 1968, abandoned.

[30] Foreign Application Priority Data

Dec. 4, 1967 Italy ................................53976 A/67

[52] U.S. Cl. ..................................331/65, 307/116, 324/41, 331/115, 331/117 R, 340/258 C

[51] Int. Cl. .................G01p 13/00, H01h 35/00, H03b 7/06

[58] Field of Search ................331/65, 115, 117 R; 307/116, 307/118; 324/40, 41; 340/38, 258 C

[56] References Cited

UNITED STATES PATENTS

| | | | |
|---|---|---|---|
| 2,820,145 | 1/1958 | Wolfendale | 331/115 |
| 2,972,116 | 2/1961 | Lowe | 331/117 R |
| 3,350,660 | 10/1967 | Engdahl et al. | 331/65 |
| 3,469,204 | 9/1969 | Magyar et al. | 331/65 |

*Primary Examiner*—John Kominski
*Assistant Examiner*—Siegfried H. Grimm
*Attorney*—Birch, Swindler, McKie & Beckett

[57] ABSTRACT

An electronic switching circuit including a transistor oscillator changeable between its oscillating and nonoscillating condition. The oscillator includes an inductor variable between an inductance at which the oscillating condition exists and an inductance at which the oscillating condition is stopped.

12 Claims, 4 Drawing Figures

PATENTED JAN 18 1972 3,636,470

INVENTORS
GUIDO FIORENTINO
ALFREDO OLIVEI

VARIABLE INDUCTANCE-CONTROLLED OSCILLATOR SWITCHING CIRCUIT

This application is a continuation of application Ser. No. 779,993 filed Nov. 29, 1968 and now abandoned.

GENERAL DESCRIPTION

The present invention relates to an electronic-switching circuit of the type in which switching states are defined by oscillatory and nonoscillatory states of an oscillator.

Devices of this kind heretofore known have many drawbacks connected with the complexity of their structure, the impossibility of inserting them in electronic circuits in suitably integrated form, their short life, their inadequate resolving power in respect of the variations in the signal, generally mechanical, controlling them and their inability to respond to control signals following one another at high frequency. In order to obtain at the output of these known devices two signal levels differentiated by a distinct voltage jump, it is necessary to insert more or less complex diode circuits, which therefore entail expenditure on components and delay in the performance of the switching. Moreover, in known devices which use an oscillator controllable to obtain two well-differentiated levels of the output signal, the variation of the Q-factor of the circuit does not act directly on the variation of the level of the output signal itself, for which reason a lack of promptness and efficiency of the devices is observed.

The object of this invention is to obviate such drawbacks. According to the invention there is provided an electronic-switching circuit comprising a transistor oscillator with an inductance and capacitor connected in series between the base and emitter of a transistor, and a feedback element in parallel with the capacitor and effective to feed back to the emitter periodic signals obtained at the base of the transistor, the circuit being adapted to assume oscillatory and nonoscillatory states depending on the value of the inductance.

DETAILED DESCRIPTION

Figure 1:
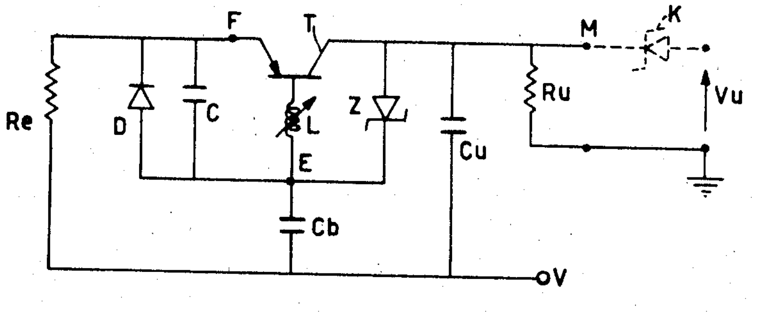
Figure 2A:
Figure 2B:
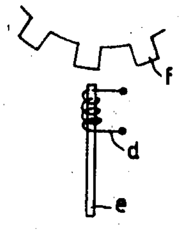
Figure 2C:
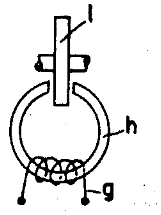

The invention will be described in more detail, by way of example, with reference to the accompanying drawing, in which:

FIG. 1 is a diagram of a circuit embodying the invention and,

FIGS. *2a*, *2b*, *2c* show three suggested constructions of the variable inductance.

The circuit of FIG. 1 includes a single transistor T fed by a single voltage V, the value of which can vary within the limits appropriate to the operating characteristics of the transistor T employed and which may be fixed at an absolute value of 20 volts, for example.

The voltage V feeds the emitter of a transistor T, which may be either of the PNP-type (as in the drawing) or of the NPN-type and have any geometry, through a bias resistor R*e*. In addition to the resistor R*e* having the function of biasing the emitter of the transistor T, it forms the path through which a capacitor C is charged. The capacitor C is discharged through the emitter-base junction of the transistor T if there exists a phase condition such as to permit the renewal of the phenomenon of charging and discharge of said capacitor C. Such phase conditions are created by a variable inductance L located in series with the base of the transistor T. This variable inductance may have the most varied form, dimensions and constructional characteristics according to the requirements of application. It can be said quite generally that a variation of inductance is obtained, according to the constructional form of the inductance, by bringing nearer or introducing a ferromagnetic part of extremely small dimensions (for example, a part with a volume of less than 1 $mm.^3$), it being clear that the device is able to detect ferromagnetic parts of widely varying dimensions at widely varying distances. The ferromagnetic material may be either in one piece or in the form of an electroplated coating or a vacuum deposit on a metallic layer or plastic of any kind.

More particularly (FIG. *2a*), the inductance may be formed simply by means of a conductor *a* wound in a coil and which is entered by a rod *b* of ferromagnetic material, which thus causes the increase of the value of the inductance, while the withdrawal of the rod restores the value of the inductance to the original value.

Another construction of the detector element formed by an inductance (FIG. *2b*) is obtained by winding a coil *d* on a rod *e* of ferrite material, with the turns extremely close and concentrated at the end of said rod so as thereby to obtain a high power of resolution. A movable element which is coupled electromagnetically with the coil *d*, by moving nearer thereto, may be of soft iron and is shown in the drawing as a toothed wheel *f*.

A further construction of the detector element (FIG. *2c*) is obtained by winding a coil *g* on a core *h* of the type used for magnetic stores, which is made of ferrite material and provided with a slot in which an element *l*, for example a toothed wheel, moves.

Returning to the circuit of FIG. 1, the periodic signal collected at the base of the transistor T and maintained due to the presence of the capacitor C and the inductance L in the state of nondetection, (i.e., with the ferromagnetic material remote from the inductance) is fed back due to a capacitor $C_b$ through a diode D poled in the direction indicated to the emitter of the transistor T. The load normally inserted between the point E and the collector of the transistor T in this embodiment is constituted by a Zener diode Z which operates to provide better stabilization of the operating values of the circuit, by controlling the collector-base voltage when the oscillator is not oscillating. The output signal V*u* is derived across a collector resistor R*u* which has the function of biasing the collector-base junction of the transistor T, for a given value of the emitter biasing resistor, while a capacitor C*u* smooths the periodic output signals, functioning as an integrator.

The operation of the circuit illustrated in FIG. 1 will now be described.

Let us assume that the inductance L is in the state of nondetection, that is we have the state in which the inductance L, which, as has been said, may be constructed in the most diverse manners, is not coupled magnetically with the movable part which actuates the switching circuit.

In order to obtain oscillators at the emitter of the transistor T, it is necessary for the condition to occur in which downstream of the points F–E there is an impedance constituted by a negative resistance and a positive reactance, that is by an inductance.

Study of the equivalent circuit downstream of the points F–E gives the result that the simultaneous conditions of negative resistance and positive reactance occur if and only if the dynamic capacitance $C_c$ (not shown in the drawing) between the collector and the base is below a certain value depending on the characteristics of the transistor T employed, and if and only if the value of the inductance L is above a certain value depending likewise on the characteristics of the transistor T employed. These two conditions can be obtained with any type of transistor by varying the value of the inductance L, by way of example, from a few thousandths of a $\mu$h. to several hundreds of mh., depending on the application of the invention. In particular, it must also be assumed that the collector-base junction is not brought to an avalanche charging rate, that is that the current gain of the transistor T employed is maintained below unity.

The association of a negative resistance and an inductive reactance downstream of the points F–E in the circuit according to the invention with the dynamic capacitance between the emitter and the base, supplemented by a fairly small external capacitor C between the points F and E, constitutes an oscillator. Therefore, under these conditions, as has already been said, the capacitor C is charged through the resistor R*e* and is discharged through the emitter-base junction of the transistor T and the periodic signal maintained at the base of the transistor due to the capacitor C and the inductance L is fed back to the emitter by means of the diode D. The positive feedback function of the diode D promotes the increase of current in the emitter and consequently in the collector, so that the value of the direct output voltage $Vu$ across the resistor $Ru$ is fairly high. With the values of the components given hereinafter, the voltage $Vu$ in the state of nondetection of the inductance L is about 12 volts DC. There is a continuous signal across the resistor $Ru$ because the capacitor $Cu$ smooths the periodic signals. The capacitor $Cu$ moreover has the function of eliminating high-frequency interference which may be present if several circuits of the type according to the invention are close to one another.

When there is a change in the detection state, that is when the inductance L is coupled magnetically with the movable element, the phase conditions necessary for ensuring the self-maintenance of the phenomenon of charging and discharging of the capacitor C are lacking. As a consequence of the inactivity of the capacitor C, there is a reduction in the consumption of current by the transistor T, which reduction is manifested at the output in a reduction in the continuous level of the voltage $Vu$ Under these conditions, it is the function of Zener diode Z to fix the level of $Vu$.

Under the nonoscillatory conditions, the output voltage $Vu$ has a value very close to $$(V-Vz)\,\frac{Ru}{Re+Ru}$$

(where $Vz$ is the cutoff voltage of the Zener diode), that is, for the values of the components given hereinafter, the voltage $Vu$ is about 3 volts DC. It is also an effect of the Zener diode Z, because of its specific characteristics, to achieve a high value of the base current of the transistor T which reaches a value of about $$\frac{V-Vz}{Re+Ru}$$

The high value of the base current promotes the subsequent reestablishment of the oscillations as soon as the Q of the coil forming the inductance L returns to the initial value due to the moving away of the movable element. During the passage from the state of detection of the movable element to that of nondetection and vice versa, the diode D which ensures positive feedback periodically through the intermediary of the capacitor $C_b$, has the function of ensuring an immediate response to the external variations due precisely to its positive feedback function, that is it has the function of ensuring an immediate maintenance or extinction of the oscillations in the circuit constituted by the capacitor C and the inductance L, which function is manifested in a rising and falling edge of the continuous output signal of less than 100 nanoseconds, in the case of the use of a transistor T of a very high frequency. To better explain the operation of the circuit according to the invention, in an oscillator circuit with a dynamic negative resistance, the addition of the diode D results in the realization of an internal clamping of the oscillations on the base of the transistor, so that the nondetection and detection state are characterized, in AC condition, by the presence or absence of oscillations. In this oscillator the diode D in parallel with the capacitor C, and the capacitor $Cb$ effect the continuous level of the base bias in a manner causing the on-off switching of the oscillations in the transistor.

It is apparent from the description of the operation of the circuit of FIG. 1 that the values of the components of the circuit must lie within well defined ranges. More particularly, the capacitor C cannot be extremely small, since otherwise the variations in the consumption of the transistor T are irrelevant, nor can it be very large, since otherwise the charging and discharge time constant of the capacitor C increases and the device in no longer able to follow control signals following one another at high frequency. The charging time constant of the capacitor C is also determined by the resistor $Re$, which serves to bias the emitter continuously. The resistor $Re$ must not be too small, because in this case the transistor T will not be under correct bias conditions, nor must it be too large, because the charging time constant of the capacitor C increases, so that the device is no longer able to follow the control signals following one another at high frequency. Moreover, the influence of the output resistor $Ru$ is manifested in the value assumed by the direct-current voltage both in the state of detection and in the state of nondetection and, furthermore, the resistor $Ru$ has the function of biasing the collector-base junction of the transistor T. Therefore, the resistor $Ru$ must also be within a well defined range of values. In fact, above a certain limit value, which is linked with the type of transistor, the base-collector junction and the Zener diode Z are not correctly biased and, as a consequence, there is no longer any variation in the output voltage level in passing from the state of detection to that of nondetection and vice versa. There is therefrom an optimum value for the resistor $Ru$ if all the other elements of the circuit and also the source of bias are kept fixed, so that there is a maximum variation in voltage level in passing from the state of detection to that of nondetection and vice versa. It is obvious that the voltage level both in the state of detection and in the state of nondetection is higher the larger the resistor $Ru$.

The low value of $Ru$ ensures a low output impedance, which may be only 100 ohms and, in any case, remains below 1,000 ohms, so that the device can be inserted directly in electronic circuits capable, for example, of performing logic functions.

The two voltage levels of +12 volts and +3 volts which are separated, as has been described, by a distinct edge or front, can therefore be used directly as logic levels without any necessity for rectification. It is possible to bring the level of 3 volts, which may express the zero logic signal, to 0 volts by simply adding another Zener diode K in series with the output terminal M, as shown in broken lines in the drawing. The same result can be obtained by using a separate supply.

Moreover, in another possible application, the device forming the object of the present invention may be employed effectively to replace the contact breaker in normal electrical ignition circuits of motor vehicle engines without making any modification or addition of components thereto, the device having greater reliability of operation and a longer working life.

Possible values of the components of the circuit of FIG. 1 are given hereunder by way of example:

$V$=+20 volts
$T$=1 W 9148 S.G.S.
$Re$=120 ohms
$C$=100 pf.
$C_b$=1,000 pf.
$C_u$=0.05 $\mu$f.
$D$=0C95 Philips
$V_z$=15 volts
$Ru$=100–2700 ohms It will be understood that many minor modifications may be made in the circuit described without departure from the scope of the invention. Accordingly, the invention is not to be considered limited to the embodiment described herein, but rather only by the scope of the appended claims.

1. An electronic-switching circuit having a transistor oscillator wherein the switching states of said circuit are determined by the oscillatory and nonoscillatory conditions of said oscillator, comprising:

a transistor, capacitance means having a terminal connected to the emitter of said transistor and variable inductance means having a terminal connected to the base of said transistor, said capacitance means and said inductance means being connected in series to form with the base-emitter junction of said transistor a closed loop oscillating circuit when said variable inductance means is at a predetermined value, feedback means connected in parallel with said capacitance means for feeding back to the emitter of said transistor signals present at the base of said transistor for maintaining an oscillating condition, once assumed, and for clamping the oscillations of said oscillating circuit when said variable inductance means is at a value other than said predetermined value, means for varying the inductance of said variable inductance means from said predetermined value at which an oscillating condition of the oscillator is assumed to a value at which the oscillating condition is stopped, and means for applying bias voltages to said transistor.

2. The electronic-switching circuit defined in claim 1 wherein said biasing means applies bias voltages between the transistor collector and the junction of said capacitor and said inductor means and between the transistor emitter and said junction, respectively.

3. The electronic-switching circuit defined in claim 1 wherein said varying means comprises a movable ferromagnetic element.

4. The electronic-switching circuit defined in claim 1 wherein said feedback means comprises a diode connected in parallel with said capacitor and poled so as to feed back positive signals to the emitter of said transistor and a second capacitor connected between the junction of said capacitor and said inductor means and the emitter of said transistor.

5. The electrical-switching circuit defined in claim 4 wherein said varying means comprises a movable ferromagnetic element.

6. The electronic-switching circuit defined in claim 4 wherein said means for applying bias voltages comprises a voltage source connected between a bias terminal and a reference potential, including:

a first resistor connected to the emitter of said transistor in series with said second capacitor, the junction between said second capacitor and said resistor being connected to said bias terminal, a third capacitor connected between the collector of said transistor and said bias terminal, and an output resistor connected between the collector of said transistor and said reference potential, the output of said switching circuit being available across said output resistor.

7. The electronic-switching circuit defined in claim 6 wherein said varying means comprises a movable ferromagnetic element.

8. The electronic-switching circuit defined in claim 1 further comprising a Zener diode connected between the collector of said transistor and the junction of said inductance means and said capacitor for controlling the collector-base voltage when said oscillating circuit is not oscillating.

9. The electronic-switching circuit defined in claim 8, wherein said varying means comprises a movable ferromagnetic element.

10. The electronic switching circuit defined in claim 8, wherein said feedback means comprises a diode connected in parallel with said capacitor and poled so as to feed back positive signals to the emitter of said transistor and a second capacitor connected between the junction of said inductance means and said capacitor and the emitter of said transistor.

11. An electronic-switching circuit, comprising:

an oscillator means having a dynamic negative resistance and a positive reactance and a capacitor connected in series and connected to said oscillator means to form a closed loop, said dynamic resistance being variable to assume negative and positive values and said reactance being variable to assume only positive values, said series combination forming an oscillatory circuit when said resistance is negative and said reactance is at a predetermined positive value so that the switching states of said switching circuit are determined by the oscillatory and nonoscillatory conditions of said oscillator, feedback means connected in parallel with said capacitor for maintaining an oscillatory condition of said oscillator when said resistance is negative and said reactance is at a predetermined positive value and for performing a clamping of the oscillations of said oscillator when said resistance is negative and said reactance is different from said predetermined value, and means for varying said resistance and said reactance from a value at which an oscillatory condition of the oscillator is assumed to a value at which the oscillatory condition is stopped.

12. The electronic-switching circuit defined in claim 11, wherein said means for varying comprises a movable ferromagnetic element adapted to vary said resistance and said reactance for the purpose of selectively controlling the oscillatory and nonoscillatory conditions of said oscillator.

* * * * *

UNITED STATES PATENT OFFICE
CERTIFICATE OF CORRECTION

Patent No. 3,636,470 Dated January 18, 1972

Inventor(s) Alfredo Olivei and Guido Florentino

It is certified that error appears in the above-identified patent and that said Letters Patent are hereby corrected as shown below:

Column 6, line 15, after "resistance" insert a comma.

Column 6, line 16, delete "and".

Column 6, line 17, delete "and connected to said oscillator means".

Signed and sealed this 26th day of December 1972.

(SEAL)
Attest:

EDWARD M.FLETCHER,JR.
Attesting Officer

ROBERT GOTTSCHALK
Commissioner of Patents